United States Patent [19]

Ruffner et al.

[11] Patent Number: 5,949,071
[45] Date of Patent: Sep. 7, 1999

[54] UNCOOLED THIN FILM PYROELECTRIC IR DETECTOR WITH AEROGEL THERMAL ISOLATION

[75] Inventors: Judith A. Ruffner; Jeff A. Bullington; Paul G. Clem; William L. Warren; C. Jeffrey Brinker; Bruce A. Tuttle, all of Albuquerque, N.Mex.; Robert W. Schwartz, Seneca, S.C.

[73] Assignee: Sandia Corporation, Albuquerque, N.Mex.

[21] Appl. No.: 08/912,949

[22] Filed: Aug. 14, 1997

[51] Int. Cl.$^6$ .................................................. H01L 23/14
[52] U.S. Cl. ........................................................ 250/338.3
[58] Field of Search ........................................... 250/338.3

[56] References Cited

U.S. PATENT DOCUMENTS

| | | |
|---|---|---|
| 4,867,850 | 9/1989 | Oka et al. ................................ 204/15 |
| 5,283,438 | 2/1994 | Dautriche ............................. 250/338.3 |
| 5,536,965 | 7/1996 | Beratan et al. ........................... 257/444 |
| 5,627,082 | 5/1997 | Beratan et al. ............................ 438/55 |
| 5,644,838 | 7/1997 | Beratan ..................................... 29/840 |

*Primary Examiner*—Constantine Hannaher
*Attorney, Agent, or Firm*—Gregory A. Cone

[57] ABSTRACT

A monolithic infrared detector structure which allows integration of pyroelectric thin films atop low thermal conductivity aerogel thin films. The structure comprises, from bottom to top, a substrate, an aerogel insulating layer, a lower electrode, a pyroelectric layer, and an upper electrode layer capped by a blacking layer. The aerogel can offer thermal conductivity less than that of air, while providing a much stronger monolithic alternative to cantilevered or suspended air-gap structures for pyroelectric thin film pixel arrays. $Pb(Zr_{0.4}Ti_{0.6})O_3$ thin films deposited on these structures displayed viable pyroelectric properties, while processed at 550° C.

32 Claims, 5 Drawing Sheets

28 blacking agent
26 top electrode
24 pyroelectric imaging element
22 bottom electrode
20 adhesion layer
18 etch stop 16 planarization layer 14 $SiO_2$ aerogel film 12 $SiO_2$ 10 Silicon wafer substrate

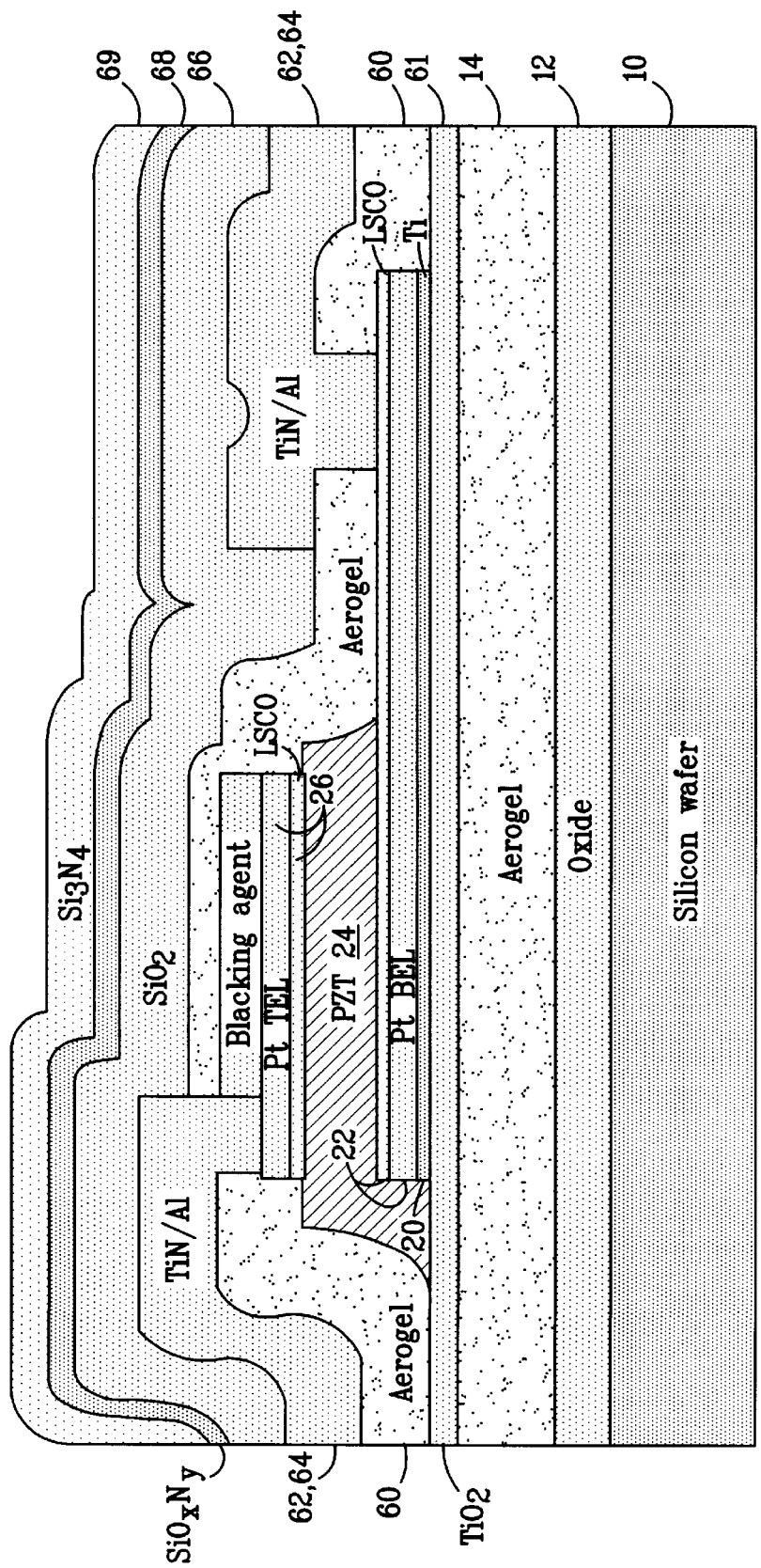

5,949,071

UNCOOLED THIN FILM PYROELECTRIC IR DETECTOR WITH AEROGEL THERMAL ISOLATION

STATEMENT REGARDING FEDERALLY SPONSORED RESEARCH OR DEVELOPMENT

This invention was made with United States Government support under Contract No. DE-AC04-94AL85000 awarded by the U.S. Department of Energy. The Government has certain rights in this invention.

CROSS-REFERENCE TO RELATED APPLICATIONS

Not applicable.

BACKGROUND OF THE INVENTION

This invention relates to infra-red (IR) detectors. More particularly, this invention relates to uncooled thermal IR detectors utilizing ferroelectric thin films as imaging elements.

Infrared detectors include both photon and thermal detectors. Photon detectors (e.g., PtSi available from Honeywell and CdTe available from Raytheon) can offer good sensitivity, fast response times, high spatial resolution, and low cost if standard semiconductor processing technology can be used. However, these detectors are sensitive to thermal noise effects and must be cryogenically cooled. The cooling units are expensive and cumbersome, making photon detectors Impractical for most consumer and military applications. In addition, semiconductor infrared detectors suffer from pixel-to-pixel signal variations that make signal processing necessary in order to obtain <1° C. resolution. The process of mathematically normalizing the signal from each pixel reduces the signal-to-noise ratio of the array.

Thermal detectors, like pyroelectric imaging elements, offer excellent performance at room temperature and do not require cooling. They are suitable for small, light-weight detection systems that are reliable and require minimal power. Until now, these detectors have been difficult and costly to fabricate. The pyroelectric imaging elements manufactured at Texas Instruments consist of a laser reticulated barium strontium titanate (BST) ceramic that has been flat-lapped to a thickness of <20 µm and then bump-bonded to an integrated circuit. The lapping process is wasteful and time-consuming, and the bonding process often leads to breakage of the very delicate BST ceramic. Therefore, the technical problem with these detector elements is that throughput is low and cost is high ($2500/detector array). In addition spatial resolution is limited (48 µm pixel size) because of the difficult bump-bonding process.

BRIEF SUMMARY OF THE INVENTION

The present invention avoids the problems of the prior detectors by employing a novel structure in conjunction with standard silicon processing techniques to achieve better performance and much lower cost. This new IR detector is built upon a silicon substrate (on which could also be combined other microelectronic elements) on which a thermal oxide is grown. Above the oxide is formed an aerogel layer to provide thermal insulation. Above this is deposited a layer of a material that serves to planarize the aerogel in order to provide a smooth and flat surface for the remaining depositions. Next is emplaced a lower electrode layer with the thin film pyroelectric layer deposited above that. On top of the structure is the upper electrode layer capped by a blacking layer to enhance the capture of thermal radiation into the detector at the appropriate wavelengths.

The pyroelectric imaging element of the present invention is much thinner and has a lower thermal mass than the bulk ceramic imaging elements (BST) discussed above. The heat capacity of the thin film imaging element is smaller, resulting in faster response times (20–50 times faster) and larger voltage responses. The response time is a function of thermal mass (and volume). The thickness of the total stack of the present invention is about 0.4–1.0 µm as opposed to about 20 µm for the Texas Instruments device. The noise equivalent temperature difference (NETD) of the present detector is 0.50° C. compared to 0.1° C. in the Texas Instruments product, indicating a 100% increase in the signal-to-noise ratio.

In addition, the aerogel layer in the present detector acts as an effective thermal isolation barrier between the imaging element and the relatively massive heat-sinking substrate. Effective thermal isolation enables the pyroelectric element to achieve the maximum thermal and temporal resolution for the imaging device. The use of an aerogel layer also results in greater thermal insulation and easier fabrication than the self-support "microbridge" structures currently being investigated. The use of aerogel thin films for thermal insulation may become the easiest, least expensive, and most reproducible fabrication method for the preparation of thin film pyroelectric arrays as a direct result of this technology.

The fully integrated design of the present uncooled IR detector enables mass production using semiconductor processing technology. This results in excellent spatial resolution (4 µm pixel size) at a greatly reduced cost (estimated about $10).

BRIEF DESCRIPTION OF THE SEVERAL VIEWS OF THE DRAWING

FIG. 6 is a cross-sectional view of a single imaging pixel in a fully integrated, 2-dimensional array embodiment of the present invention.

DETAILED DESCRIPTION OF THE INVENTION

Integrated ferroelectric thin films possess several attractive qualities for use in uncooled infrared (IR) pyroelectric imaging arrays. The high pyroelectric coefficients [p(nC/cm$^2$K)=dP/dT] and small thermal masses of these films, which may integrated on silicon at low temperatures, enable efficient thin film arrays for infrared imaging applications. Critical factors for pyroelectric imaging applications including the pyroelectric current, response time, and noise equivalent temperature difference (NETD) of an imaging array are listed in Table 1.

Figure 5:
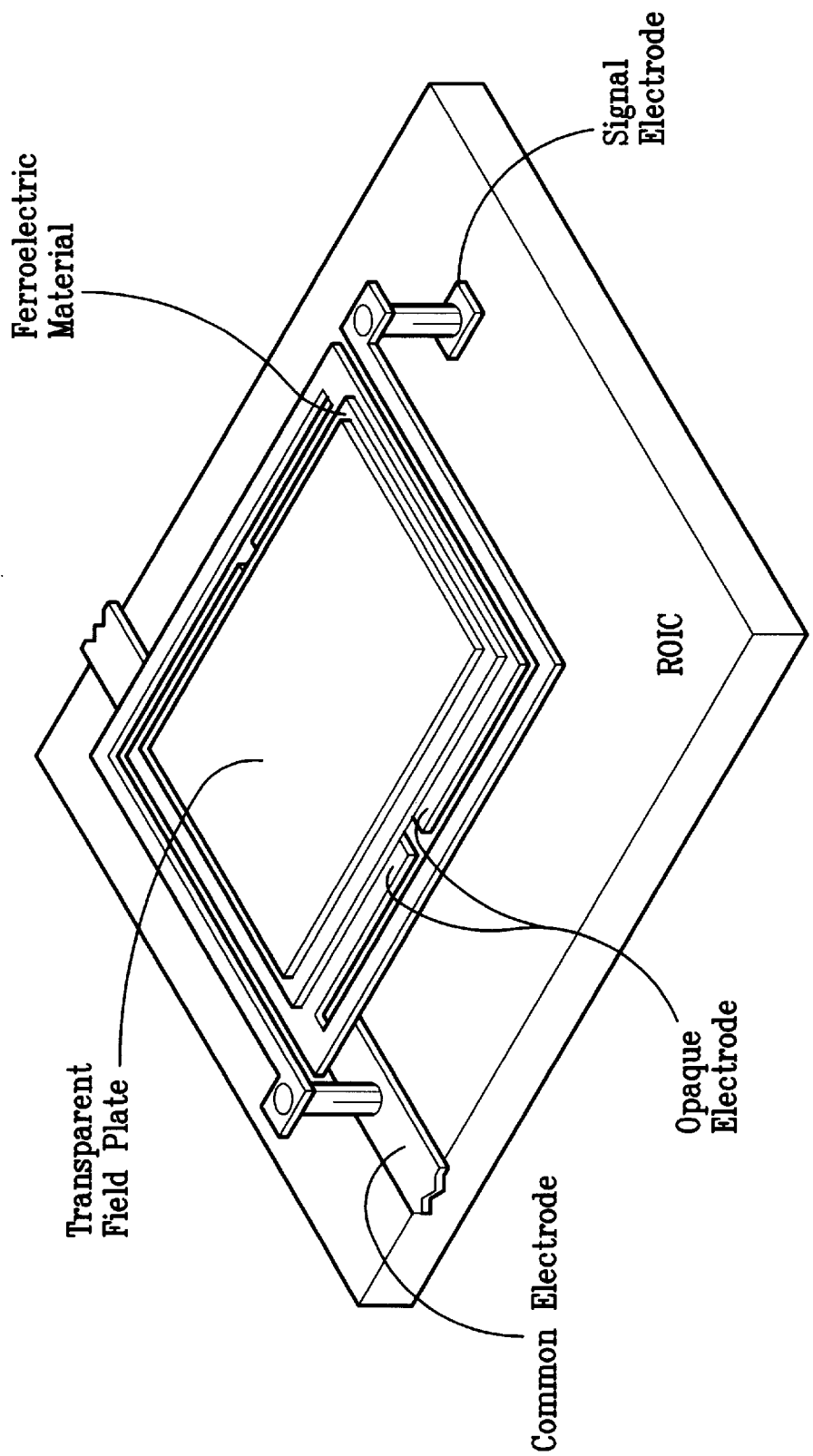
FIG. 5 shows a schematic for a prior art uncooled infrared pyroelectric device that uses microbridge technology to thermally isolate the imaging element from the substrate.

For device applications, high sensitivity may be expressed as a low noise equivalent temperature difference (NETD), indicative of the approximate temperature variation due to system noise. Since NETD scales as the square root of substrate thermal conductance G, thin film pyroelectric pixels require thermal isolation from the device substrate. Several groups are pursuing micromachined ferroelectric thin film structures suspended above a substrate like that in FIG. 5, utilizing the relatively low thermal conductivity of air to achieve such thermal isolation and increased device sensitivity.

TABLE 1

Selected pyroelectric imaging factors

| | |
|---|---|
| $I = pA \Delta T/\Delta t$ | pyroelectric current |
| $F_V = p/3.3 \, \epsilon_o \epsilon_r$ | voltage figure of merit |
| $\tau = C/G$ | response time = $\frac{\text{heat capacity}}{\text{thermal conductance}}$ |
| NETD $\alpha$ $G^{1/2}$ | NETD = noise equivalent temp. difference |

Figure 2:
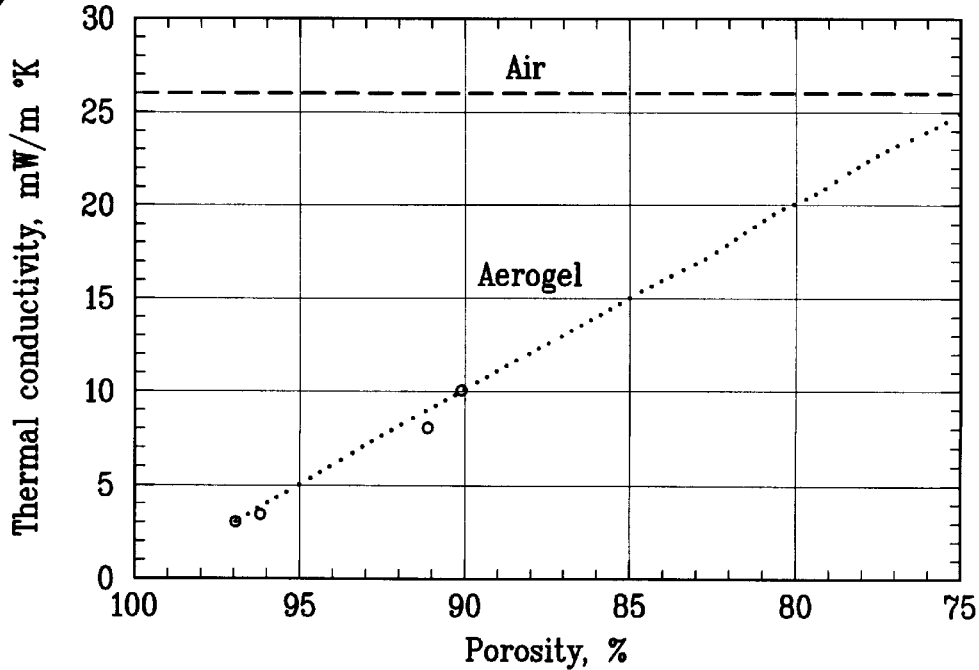
FIG. 2 is a graph showing the thermal conductivity of aerogels as a function of the % porosity.

An alternative approach is presented here: use of aerogel thin films to achieve thermal isolation, but in a monolithic structure, avoiding potential complications associated with the micromachining of suspended or cantilevered devices. Silica-based aerogels, typically characterized by 70–99% porosity of a ≈10 nm silica framework with ≈50 nm pores, possess thermal conductivities lower than air (FIG. 2), spurring interest in use for a variety of thermal isolation applications. Recently, Brinker and co-workers demonstrated aerogel thin film deposition, whereby 0.4–2 $\mu$m thickness aerogel films with up to 98% porosity may be rapidly deposited by dip coating or spin coating onto silicon wafers, enabling use of aerogel thin films as thermal isolation interlayers within a multilayer thin film structure (S. Prakash, C. J. Brinker, A. J. Hurd, and S. Rao, "Silica aerogel films prepared at ambient pressure by using surface derivatization to induce reversible drying shrinkage," in Nature 374, 439–443 (1995). Aerogel thin films were deposited by dip coating on 3" silicon wafers, following the procedure outlined by Prakash et al., supra. This procedure comprises, in brief, preparing the silicate sols, aging the sols, conducting a pore fluid washing procedure, derivatizing the surface hydroxyl groups with trimethylsilyl groups, re-liquefying the gel with using ultrasound, dip-coating the substrate. The resulting aerogel layer has a porosity of about 60% which is then increased to over 90% by pyrolizing the aerogel for about an hour at about 450° C. Although the aerogel used here was based on $SiO_2$, a variety of other ceramics could be considered as candidates, although the silicon-based aerogel would appear to be preferred due to its similar chemistry to the Si microelectronic processing associated with the sensor.

In more detail, the aerogel films are prepared by the following process. The basic starting chemicals or solutions for the preparation of the gel are the stock solution, ethanol and the base catalyst which is Ammonium Hydroxide ($NH_4OH$) in this case.

Preparation of "Stock" Solution (volumes may be multiplied)

| Volume | Approximate molar ratio |
|---|---|
| 61 ml Tetraethoxysilane | 1 |
| 61 ml absolute ethanol | 4 |

-continued

| Volume | Approximate molar ratio |
|---|---|
| 4.87 ml deionized water | 1 |
| 0.2 ml 1M HCl | 0.007 |

Add chemicals to the reaction kettle in the order listed. Seal, assemble condenser, and heat to 60° C., 1.5hrs(90 min.), with stirring. Cool, store in closed bottle in flammable-approved refrigerator or freezer if possible. Solution is stable indefinitely at 20° C.

Preparation of the gel. Warm the stock solution after taking it out of the freezer and add 0.05 M $NH_4OH$ to promote gelation. The volume ratio of the stock solution: base: ethanol is 10:1:44. For 10 ml of the stock solution, one needs to add 1 ml of base and 0.44 ml of ethanol. Thus, typically 55 ml of gel is prepared before proceeding to subsequent stages of the process. Then the gel is aged at 50° C. in the aging oven for 4 days(note that this 4 days of time includes the gelation and aging time which are approximately 2 days each). Now, the gel is ready for the pore fluid exchange washes.

Pore Fluid Exchange.

The gel is washed three times in three hours with surplus ethanol (surplus implies typically around 60–70 ml for 55 ml of gel) at 50° C. Then it is washed two times in four hours with surplus hexane at 50° C. Now, the gel is ready to undergo surface derivatization which is the essence of the springback phenomenon which contributes to the high porosity of these films.

Surface Derivatization.

The surface derivatization is done with Trimethylchlorosilane (TMCS) in Hexane. Typically 5 volume % of TMCS is taken in Hexane(for example 5 ml of TMCS added to 95 ml of Hexane). The gel is kept soaked in this surplus silylating solution for about 20 hours also at 50° C. After the derivatization is over, the gel is washed depending on what would be the final solvent. If the final solvent is hexane, it is just washed two times with surplus hexane in two hours but if the final solvent is ethanol, it is washed once with surplus hexane in one hour followed by two times with surplus ethanol in two hours. The stock solution can be stored indefinitely at this point and removed when one desires to proceed with deposition on a particular wafer.

Sonication.

This involves the breaking up of the gel using ultrasound vibrations. As soon as all the washes are over, some amount of the final solvent is added additionally to the wet gel and the gel is broken down ultrasonically. A redispersed sol results from which one can obtain films using different coating techniques such as spin and dip coating.

The final steps (after surface derivatization) include: Sonication (20–25 minutes); Spin coating (30 minutes); and Pyrolyzing (1 hour at 450° C.). Total time including upramp and downramp is about 2.5 hours.

This particular process employs dip coating and results in a film of about 3.5 $\mu$m thickness. Preferably the thickness of the aerogel is probably somewhat less at about 1–2 $\mu$m thickness with a porosity of greater than about 70%. The uniformity of dip coated films is typically less than for spin coated films. However, when the above process was used in spin coating the aerogel, there were problems relating to the volatility of the solvents used and striations in the film. The high volatility of the hexane produced uneven drying because of the severe temperature and concentration gradients in the spin coating process. It was decided to substitute heptane for hexane in the pore fluid exchanges, the surface derivatization, and the post-derivatization washes. This has resulted in a striation-free film of about 0.90 $\mu$m thickness and refractive index of about 1.07 which corresponds to a porosity of about 83%. The maximum thickness variation is less than about 10%. Experimentation continues to achieve thicker films with the spin coating process.

As-deposited aerogel thin films of thickness 0.4–1.2 $\mu$m were electroded by RF sputtering subsequent layers of $TiO_2$ (600 Å), Ti (300 Å), Pt (2000 Å), and LSCO (600 Å). Ti promoted adhesion of the Pt layer, and LSCO was found to aid in reducing the crystallization temperature of PZT layers. Use of a lower crystallization temperature increases the survivability of the underlying aerogel layer. The electrode/aerogel/silicon stack was annealed at 550° C. for 30 minutes to crystallize the LSCO ($La_{0.5}Sr_{0.5}CoO_3$), which is typically amorphous as-sputtered.

PZT thin films were deposited by solution deposition using a methanol-based "inverted mixing order" (IMO) metal acetate/metal alkoxide system described in detail in R. W. Schwartz, R. A. Assink, and T. J. Headley, "Spectroscopic and Microstructural Characterization of Solution Chemistry Effects in PZT Thin Film Processing," in *Ferroelectric Thin Films II*, Mat. Res. Soc. Symp. Proc. 361, 377–387 (1995). Solutions of 0.4M concentration spin coated at 3000 rpm reproducibly deposit 100 nm thick PZT films with high quality on substrates such as platinized silicon. For deposition on the electroded aerogels, however, modifications were necessary to address film stress and electrode smoothness issues. Typically, multiple layers of 0.1M solutions were spin coated on the electroded aerogel substrates, with hot plate treatments to 300° C. between each layer, and crystallization at 550° C. for 30 minutes every third layer. Films of 100–400 nm thickness were produced by repeating this cycle. Films so processed were top electroded with shadow masked, sputtered Pt electrodes (100 nm), and electrically characterized for dielectric and ferroelectric properties using a Hewlett Packard 4284A precision LCR meter and a Radiant Technologies RT-66A test unit, respectively. Pyroelectric measurements were obtained using the Byer-Roundy method, using a computer-controlled Signatone hot stage for linear heating and cooling ramp rates, and a Keithley 236 source measure unit to monitor current. Samples were poled at 300kV/cm for 30s, and held 15 minutes after poling before pyroelectric measurement. Pyroelectric measurements were repeated three times on heating and cooling to avoid any current transients associated with the film poling process.

A composite PZT//LSCO//Pt//aerogel/silicon structure was fabricated by this process. The 400 nm PZT film was produced by firing at 550° C. for 30 minutes on the electroded 0.4 $\mu$m aerogel film. The PZT film is characterized by a 0.3 $\mu$m grain size and appears to be single phase $Pb(Zr_{0.4}TiO_{0.6})O_3$, without evidence of pyrochlore or fluorite phases. The fine grain size suggests monodomain PZT grains may result, which would be advantageous if orientation may be controlled. Initial use of 0.4M solutions to deposit 100–400 nm PZT layers on the electroded aerogels gave rise to low yields and extensive shorting of PZT film capacitors. Before PZT deposition, the LSCO//Pt//aerogel//Si substrates appeared to exhibit long-range surface roughness suggested by diffuse reflection of background light. While AFM measurements indicated $\approx$10 nm surface roughness, a longer range was suspected due to this diffuse appearance and the $\approx$50 nm porosity typical of aerogels. Following the concept of other solution-deposition work used to planarize rough surfaces (see A. S. Holmes et al., "Fabrication of buried channel waveguides on silicon substrates using spin-on glass", Applied Optics 32(25), 4916 (1993)), multiple thin coatings of PZT were deposited by use of more dilute 0.1M solutions. Individual layers were heated on a hot plate to 300° C. between depositions, and crystallized by heating to 550° C. for 30 minutes after every 34 layers. After 3–6 depositions (100–200 nm) of these PZT thin layers, the films exhibited little specular scattering, and displayed 80–100% pixel yields. Individual heat treatment of thinner layers is also believed to minimize tensile stress accumulation above the aerogel, as layers undergo less densification on each heat treatment.

Ferroelectric properties of these thin films on LSCO//Pt//aerogel//Si substrates were compared with identically-processed PZT layers deposited on LSCO//Pt/Si substrates and LSCO//Pt//MgO substrates to gain an understanding of substrate stress effects on ferroelectric properties. It has been observed that PZT films deposited on high thermal expansion coefficient oxide substrates such as MgO and $Al_2O_3$ are in compressive stress on cooling to room temperature, inducing c-axis orientation and square hysteresis loops with a large $P_r$. In contrast, films deposited on platinized silicon substrates are typically in tensile stress, with a-axis orientation and less square hysteresis loops. It was hoped in the current research that use of an aerogel thin film might elastically decouple the film from the substrate, resulting in enhanced ferroelectric and pyroelectric properties.

Figure 4:
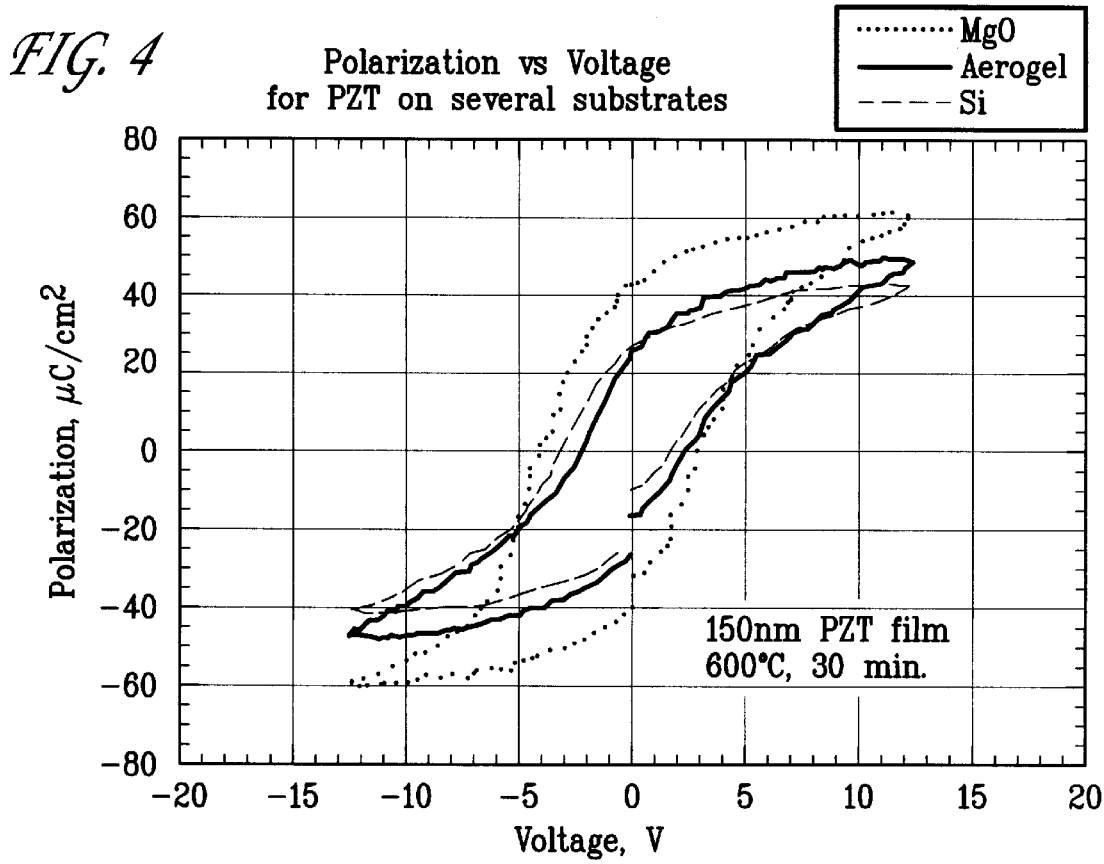
FIG. 4 is a graph showing hysteresis loops for PZT on various substrates.

Hysteresis loops for 200 nm layers of $Pb(Zr_{0.4}Ti_{0.6})O_3$ on the MgO, aerogel, and silicon substrates are shown in FIG. 4. While some modest stress decoupling may be responsible for the shape of the hysteresis loop on the aerogel, the overall shape is more akin to PZT in tensile stress on silicon. Thin film x-ray diffraction indicated the film to be dominantly a-axis oriented atop the aerogel, further confirming this possibility. Future research will investigate whether decoupling may be achieved for individually etched 50$\mu$m pixels, rather than the coherent film on a 3" wafer investigated here.

Pyroelectric measurements were obtained for a variety of PZT-based compositions on platinized silicon and MgO, and for $Pb(Zr_{0.4}Ti_{0.6})O_3$ on the aerogel structure. Pyroelectric measurements, voltage figures of merit, and calculated NETD values for several compositions are shown in Table 2. Films of $Pb(Zr_{0.4}Ti_{0.6})O_3$ on the electroded aerogel displayed a pyroelectric coefficient of 30 $nC/cm^{2\circ}K$, and a calculated NETD of 0.07° C., assuming f /1.0 optics, G=5× $10^8$ W/K thermal conductance, and a 50 $\mu$m pixel size. The thermal conductance value used, typical of air-gap structures, is probably conservative, since aerogels enable potentially even lower thermal conductivity. Measurements of actual thermal conductivity and conductance for aerogel structures are in progress. Several other PZT compositions appear to show promise for achieving similar NETD values. As discussed earlier, deposition of films on sapphire and MgO substrates has been observed to produce c-domain oriented films, with predicted greater pyroelectric coefficients as well. This appears to be the case for the highest pyroelectric coefficient observed to date, 71 $nC/cm^{2\circ}K$ for PLZT May 5/30/70 on platinized MgO, on first heating after the poling process. While results on first heating occasionally produce exaggerated pyroelectric current values, ostensibly related to post-poling phenomena, an NETD value of 0.04° C. was calculated for this composition. All other values in Table 2 are from second and third heating cycles, with good agreement to respective values on cooling.

TABLE 2

Measured PZT-based thin film pyroelectric values

| Thin film | substrate | p(μC/cm²K) | Fv (cm²/C) | NETD (calc.) |
|---|---|---|---|---|
| PZT 85/15 | Pt/Si | 0.012 | 95 | 0.17° C. |
| PZT 30/70 | Pt/Si | 0.034 | 184 | 0.09° C. |
| PLZT 4/50/50 | Pt/Si | 0.040 | 196 | 0.08° C. |
| PLZT 3/30/70 | Pt/Si | 0.060 | 272 | 0.06° C.* |
| PTaZT 4/50/50 | Pt/Si | 0.064 | 313 | 0.05° C. |
| PLZT 5/30/70 | LSCO/Pt/MgO | 0.071 | 475 | 0.04° C.* |
| PZT 40/60 | LSCO/Pt/aerogel/Si | 0.030 | 219 | 0.07° C. |

*measured on first heating of film

Pyroelectric properties were measured for several compositions of pure, lanthanum-doped, and tantalum-doped PZT, often based on PZT 30/70 or 40/60, since they allow low temperature (550° C.) crystallization. This property is expected to be advantageous for compatibility with integrated circuit metallization layers, as well as the aerogel film. The maximum aerogel processing temperature is near 600° C., above which the aerogel rapidly densifies, losing its thermal isolation properties. Ferroelectric properties of $Pb(Zr_{0.4}Ti_{0.6})O_3$ were essentially the same for processing at either 550° C. or 600° C., with only a mild increase in $P_r$ from $28\mu C/cm^2$ to $30.5\mu C/cm^2$.

Figure 1:
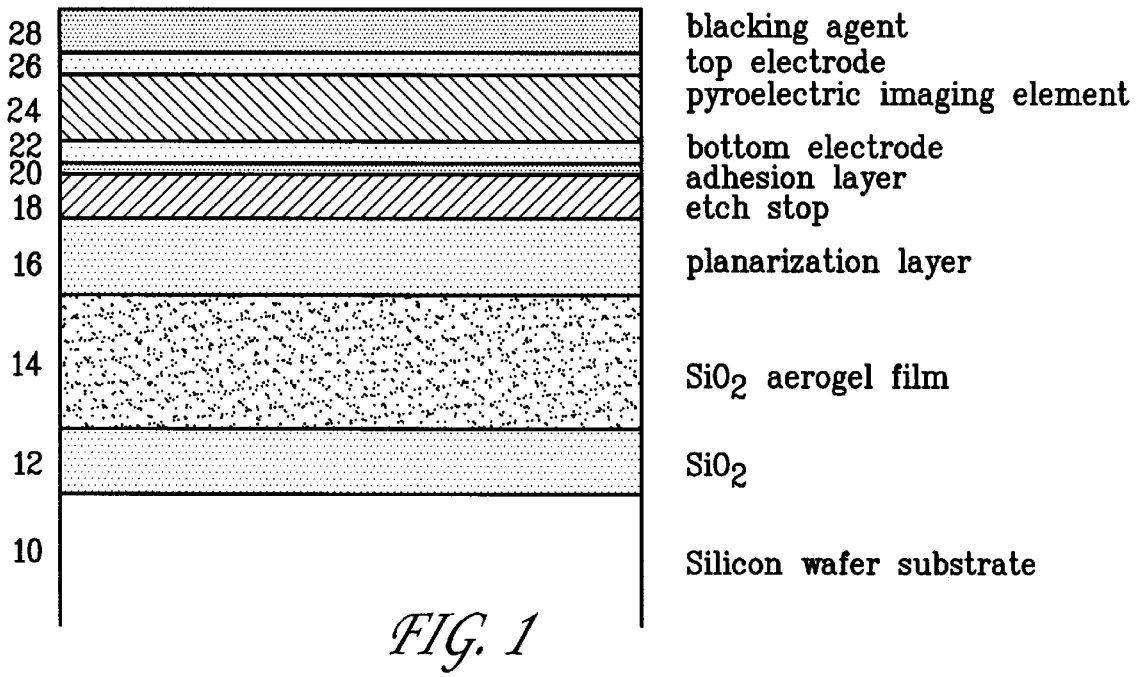
FIG. 1 is a cross-sectional view of one embodiment of the structure of the detector.

What follows is a listing of the process steps that can be used to produce one embodiment of the uncooled IR detector of this invention as shown in FIG. 1. For elements above the blacking agent, reference should be made to FIG. 6.

1. Process the silicon substrate 10 through a standard semiconductor process flow up until the process step where the first metallization is deposited. The gate of the transistor can be made from a doped polysilicon. Doped polysilicon will withstand the thermal cycling required to crystallize the ceramic/pyroelectric thin film.

2. A 1 μm layer of $SiO_2$ 12 is deposited as a protective layer on top of the underlying transistors/circuitry.

3. Deposit an aerogel thermal insulating layer 14 on the protective dense $SiO_2$. The aerogel is deposited by a sol-gel deposition technique and is ~0.4 μm thick.

4. Deposit a dense $SiO_2$ layer 16 on the aerogel to encapsulate and planarize the aerogel. This can be achieved by RF sputtering. The dense layer is ~200 Å to 400 Å thick. Alternatively, a lower porosity solgel could be used.

5. On the dense $SiO_2$ layer deposit a ~1000 Å of Ti metal by sputter deposition or e-beam evaporation. The Ti will become an etch stop 18 for a subsequent processing step. When the PZT is etched the aerogel will also be etched without the etch stop.

6. Pattern and etch Ti metal layer to yield Ti metal pads. There are several dry and wet etchants for Ti metal. One wet etchant is dilute $H_2O_2$.

7. Oxidize the Ti Metal to $TiO_x$ 20.

8. Using a lift-off technique pattern the bottom electrode stack for the pyroelectric element. This includes a quick exposure to an $O_2$ plasma to remove any residual organic material for the vias.

9. Deposit a glue layer 20 for the pyroelectric metal stack. This typically is 500 Å of Ti metal.

10. Deposit 1000 Å of Pt by sputtering.

11. Deposit 1000 Å of LSCO by sputtering Steps 8, 9, 10 can be executed at the same time. The Pt and LSCO together form the lower electrode 22.

12. Finish the patterning by removing the excess material and photoresist with an ultrasonic acetone rinse.

13. Deposit the pyroelectric ceramic thin film ~1 μm 24 by a sol-gel process.

14. Pattern and etch the ceramic pyroelectric material 24. The etchant is 6 to 1 $BOE+3HCL+HNO_3+10\ H_2O$.

15. Using a lift-off technique, pattern the top electrode stack for the pyroelectric element. This includes a quick exposure to an $O_2$ plasma to remove any residual organic material for the vias.

16. Deposit 1000 Å of LSCO by sputtering Steps 8, 9, 10 can be executed at the same time.

17. Deposit 1000 Å of Pt by sputtering. The LSCO and the Pt form the upper electrode 26.

18. Deposit the blacking element 28. Steps 16, 17, 18 can be deposited at the same time.

19. Finish the patterning by removing the excess material and photoresist with an ultrasonic acetone rinse.

20. Deposit 1 μm of $SiO_2$ aerogel 60 to thermally isolate the pixels in the lateral dimensions and to serve as a protective coat.

21. Pattern and etch the $SiO_2$ to expose the contact to the top and bottom electrode for the pyroelectric structure.

22. Deposit 500 Å TiN metal 62 as a barrier metal between the Al 64 and pyroelectric metal contact.

23. Pattern and etch vias to the source, gate, and drain. This can be accomplished by a $CF_4$ Plasma Etch.

24. Remove Photoresist using a standard resist strip.

25. Deposit Al 64 to make contact to the pyroelectric electrode stack and semiconductor structures (W, TiW or Cu can also be used).

26. Pattern and etch the Al 64 metal.

27. Remove Photoresist using a standard resist strip.

28. Deposit ~2 μm $SiO_2$ 66 layer as a scratch protection.

29. Deposit 500 Å of Oxy-nitride 68.

30. Deposit 2000 Å of $Si_3N_4$ as an encapsulation 69.

31. Pattern and etch the $SiO_2$ and $Si_3N_4$ to expose bonding pads.

32. Remove Photoresist using a standard resist strip.

33. Saw wafer and package.

Figure 3A:
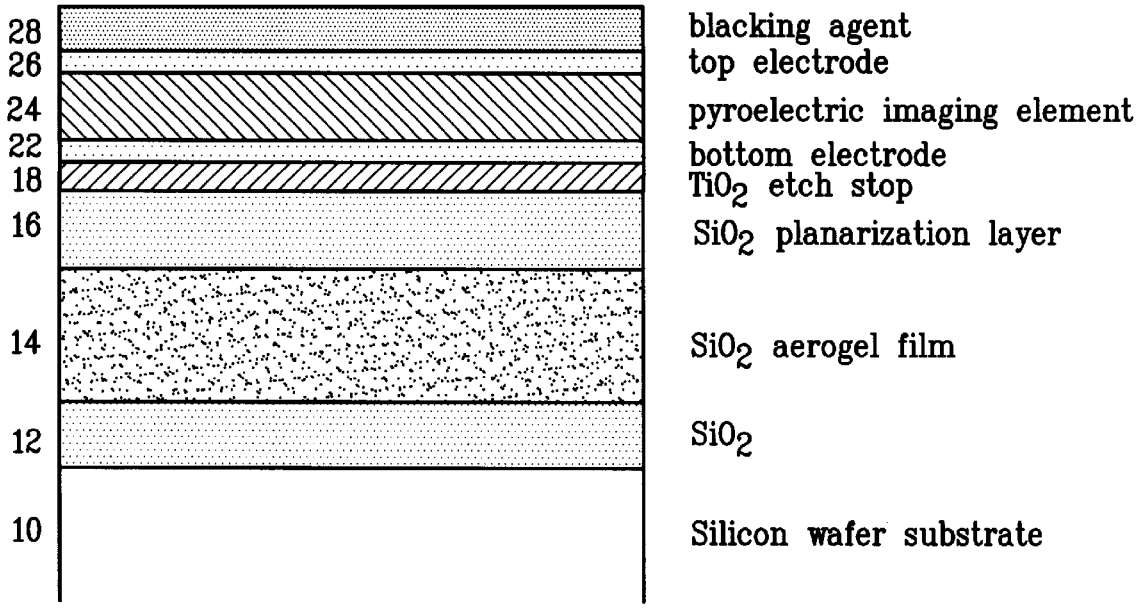
FIGS. 3A, 3B and 3C are cross-sectional views of three other embodiments of the structure of the detector.
Figure 3B:
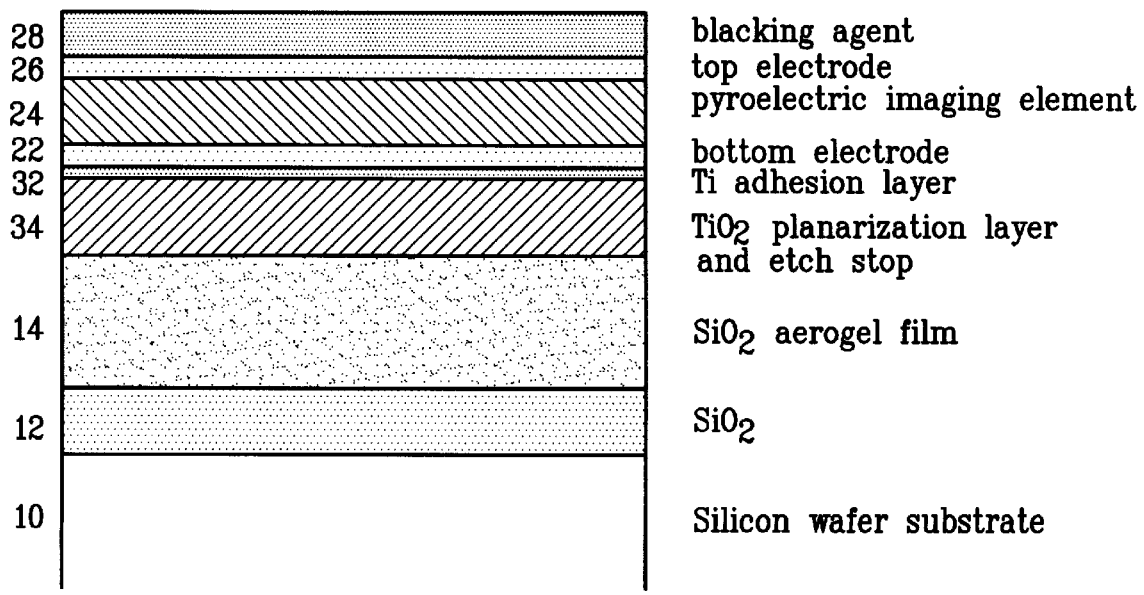
Figure 3C:
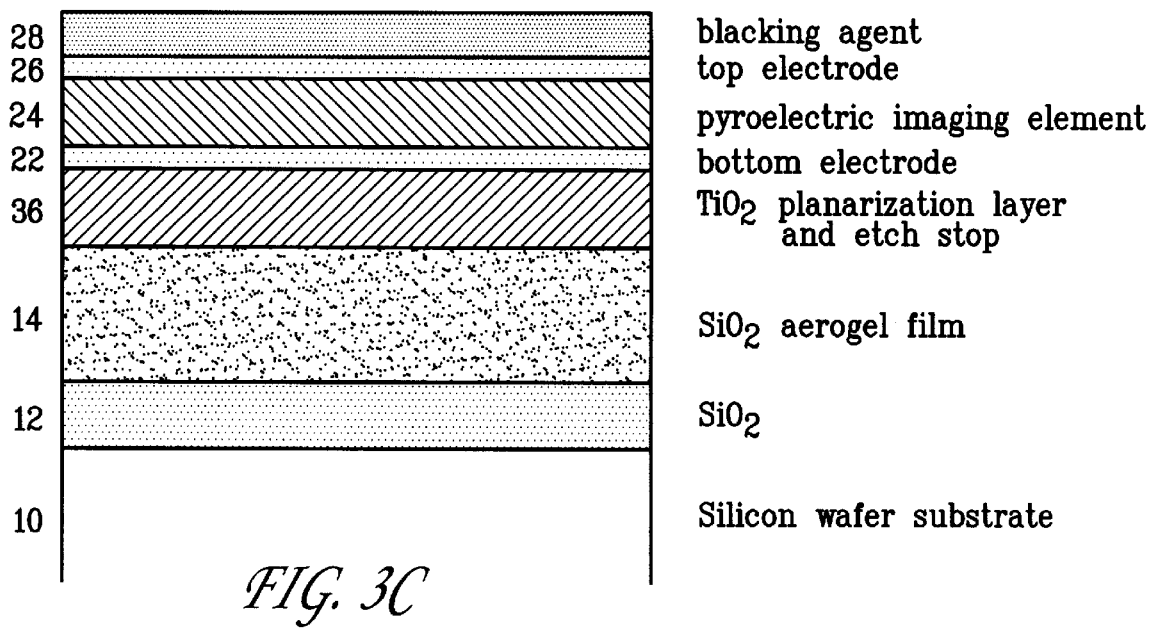

The alternative structures shown in FIGS. 3A, 3B and 3C differ in the details of making the transition between the top of the aerogel film layer and the base of the pyroelectric imaging layer. In all of these structures, the desired outcome is to be able to present a planar surface for the deposition of the layers above the aerogel to allow them to perform optimally. The problem is that the upper surface of the aerogel layer is quite rough. In FIG. 3A, the Ti adhesion layer 20 has been omitted. In some cases this will result in better adhesion between the layers. In FIG. 3B, a much thicker (≈1000–5000Å) $TiO_2$ is used both as the etch stop and as the planarization layer (instead of the $SiO_2$ in FIG. 1). This variation is also used in the structure shown in FIG. 6. In FIG. 3C, the much thicker $TiO_2$ layer 36 substitutes for layers 16, 18 and 20 in FIG. 1. It is often advantageous to omit the Pt thin layers in the electrodes to avoid the risk of Pt hillock formation and also to reduce the number of process steps.

The pyroelectric thin film imaging element (0.114 2 μm thick) is composed of a material that is selected on the basis of its pyroelectric response over the operational temperature range (about 0–40° C.) of the sensor and include barium strontium titanate (BST: $Ba_{1-x}Sr_xTiO3$), lead scandium tantalate (PST: $PbSc_xTa_{1-x}O_3$), lead lanthanum titanate (PLT: $Pb_xLa_{1-x}TiO_3$), and lead lanthanum zirconate titanate (PLZT: $Pb_xLa_{1-x}Zr_yTi_{1-y}O_3$). The pyroelectric response can be optimized by changing the compositions of these material systems. Deposition and processing of these thin film materials at temperatures up to 650° C. does not affect the underlying silica aerogel thin film detrimentally. Thinner films give higher resolution.

The pyroelectric response of a material is dependent upon the change in spontaneous polarization and dielectric constant with respect to temperature ($dP_s/dT$ and $d\varepsilon/dT$ respectively). These quantities can be measured accurately and correlated with the compositions, thicknesses, and depositions and processing parameters of the integrated structure. This iterative process allows one to adjust the design and fabrication techniques to optimize pyroelectric response.

For some materials, $dP_s/dT$ and $dF/dT$ are lower in thin film than in bulk as a result of strain within films. If the pyroelectric response to changes in temperature is too low, one can enhance it by doping the films with acceptor impurities (Fe, Mn, Co, Ni) which are known to create charged impurity and oxygen vacancy centers. These charge centers can complex and form defect-dipoles which can be aligned to enhance polarization by biasing the dielectric. Near the Curie temperature, however, one can anticipate that the defect-dipoles become randomly oriented. This should increase the $dP_s/dT$ value and increase the overall pyroelectric response significantly. In addition, we can fabricate more reliable pyroelectric films by adding dopant donors (W, Ta, and Nb) that reduce imprint. Finally, one can codope pyroelectric films with both donors and acceptors in order to suppress the traps that cause imprint and to create defect-dipoles that enhance pyroelectric properties, respectively.

The Figures depict a separate blacking layer. The purpose of the blacking layer is to maximize absorption of radiation within the spectral bands of interest (2–5 $\mu$m and 10–14 $\mu$m) and subsequently increase the signal to noise ratio of the sensor. Some blacking agents, i.e. lamp black absorb radiation efficiently at a fairly broad bandwidth of radiation. However, other blacking agents absorb efficiently only within fairly narrow bandwidths. Hence, for applications where the absorption should be limited to particular bandwidths, one would choose a blacking agent suitable to the task. Such a selection is within the ordinary skill in the art. Only the blacking agent (step 18) need be changed to accomplish the particular desired result. The LSCO material used in the top electrode displays some of these characteristics and might eliminate the need for a separate blacking layer on top.

Various other material substitutions may be made. Although Si was used as the substrate in the example, other materials such as MgO and $A_2O_3$ could also be used.

What is claimed is:

1. An integrated thin film infrared photodetector comprising:
   a substrate,
   an aerogel layer above the substrate,
   a lower electrode layer above the aerogel layer,
   a pyroelectric layer above the lower electrode layer, and
   an upper electrode layer above the pyroelectric layer, wherein the photodetector is realized as a monolithically formed device and the thickness of the layers is less than about 3$\mu$m.

2. The photodetector of claim 1 further including a planarization layer between the aerogel layer and lower electrode layer wherein the planarization layer has a planar surface facing the lower electrode layer.

3. The photodetector of claim 1 wherein the pyroelectric layer is a composite of a multiplicity of thinner, individually formed pyroelectric layers.

4. The photodetector of claim 1 additionally comprising a blacking layer formed atop the upper surface of the upper electrode layer.

5. The photodetector of claim 1 wherein the substrate comprises Si.

6. The photodetector of claim 5 additionally including a planarization layer formed of a material which is selected from the group consisting of $SiO_2$, a second aerogel layer having a porosity below 60%, and $TiO_2$.

7. The photodetector of claim 1 wherein the aerogel is a $SiO_2$-based material with a porosity in excess of 70%.

8. The photodetector of claim 7 wherein the aerogel porosity is in excess of 90%.

9. The photodetector of claim 1 wherein the pyroelectric layer is a material selected from the group consisting of barium strontium titanate (BST: $Ba_{1-x}Sr_xTiO_3$), lead scandium tantalate (PST: $PbSc_xTa_{1-x}O_3$), lead lanthanum titanate (PLT: $Pb_xLa_{1-x}TiO_3$), and lead lanthanum zirconate titanate (PLZT: $Pb_xLa_{1-x}Zr_yTi_{1-y}O_3$).

10. The photodetector of claim 9 wherein the lower and upper electrode layers comprise a conductive oxide and wherein a planarization layer is present between the aerogel layer and the lower electrode layer, such that a planar surface faces the lower electrode layer.

11. The photodetector of claim 10 wherein the conductive oxide is lanthanum strontium cobalt oxide (LSCO: $La_xSr_{1-x}CoO_3$).

12. The photodetector of claim 11 wherein the lower electrode additionally includes a layer of Pt between the LSCO of the electrode layer and the planarization layer.

13. The photodetector of claim 12 wherein the planarization layer is selected from the group consisting of $SiO_2$, a second aerogel layer having a porosity below 60%, and $TiO_2$.

14. The photodetector of claim 13 wherein the planarization layer is selected from the group consisting of $SiO_2$ and a second aerogel layer having a porosity below 60%.

15. The photodetector of claim 14 additionally comprising an etch stop layer of $TiO_2$ between the planarization layer and the lower electrode.

16. The photodetector of claim 15 additionally comprising an adhesion layer of Ti between the etch stop layer and the lower electrode.

17. The photodetector of claim 1 wherein the pyroelectric layer includes dopant donors selected from the group consisting of W, Ta, and Nb and combinations thereof.

18. The photodetector of claim 1 wherein the pyroelectric layer includes dopant acceptors selected from the group consisting of Fe, Mn, Co, Ni and combinations thereof.

19. A process for forming an integrated thin film infrared photodetector comprising:
   (a) forming an aerogel layer above a surface,
   (b) forming a planarizing layer of a material above the aerogel layer that presents a planar upper surface,
   (c) forming a lower electrode layer above the planarizing material layer,
   (d) forming a layer of a pyroelectric material above the lower electrode, and
   (e) forming an upper electrode layer above the pyroelectric material layer, wherein the forming steps (a) through (e) are conducted in sequential order and the thickness of the layers is less than about 3$\mu$m.

20. The process of claim 19 wherein the aerogel is formed from a $SiO_2$-based precursor to a thickness of about 1–2 $\mu$m and with a porosity greater than about 60%.

21. The process of claim 19 wherein the planarizing material is selected from the group consisting of $SiO_2$, a second aerogel layer having a porosity below 60%, and $TiO_2$.

22. The process of claim 21 wherein the $SiO_2$ or $TiO_2$ is formed by a process of sputter deposition.

23. The process of claim 19 wherein the pyroelectric material is selected from the group consisting of barium strontium titanate (BST: $Ba_{1-x}Sr_xTiO_3$), lead scandium tantalate (PST: $PbSc_xTa_{1-x}O_3$), lead lanthanum titanate (PLT: $Pb_xLa_{1-x}TiO_3$), and lead lanthanum zirconate titanate (PLZT: $Pb_xLa_{1-x}Zr_yTi_{1-y}O_3$).

24. The process of claim 23 wherein the pyroelectric material is formed in a multiplicity of thin individual layers with each individual layer being heated to about 300° C. prior to the deposition of the next individual layer and with periodic crystallization heating at about 550° C. being conducted after at least two individual layers have been formed until all the individual layers have been formed to achieve a total thickness for the pyroelectric layer of about 0.3–2 $\mu$m thickness.

25. The process of claim 24 wherein the pyroelectric material is PLZT.

26. The process of claim 19 further including forming a blacking agent layer above the upper electrode layer.

27. The process of claim 19 further including forming metal interconnection means between the upper and lower electrodes and other electronic circuitry apart from the photodetector.

28. The process of claim 27 wherein the metal interconnection means are a metal interconnection stack comprising a barrier metal and an interconnection metal.

29. The process of claim 28 wherein the barrier metal is formed over at least a portion of the upper and lower electrode layers.

30. The process of claim 29 wherein the interconnection metal is formed over the barrier metal.

31. The process of claim 30 wherein the barrier metal is TiN.

32. The process of claim 31 wherein the interconnection metal is selected from the group consisting of Al, W, TiW, Cu and combinations thereof.

* * * * *